United States Patent
Benedix et al.

(10) Patent No.: US 6,798,051 B2
(45) Date of Patent: Sep. 28, 2004

(54) CONNECTION OF PACKAGED INTEGRATED MEMORY CHIPS TO A PRINTED CIRCUIT BOARD

(75) Inventors: Alexander Benedix, München (DE); Reinhard Düregger, Poing (DE); Robert Hermann, Pipinsried (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/197,793

(22) Filed: Jul. 18, 2002

(65) Prior Publication Data

US 2003/0015777 A1 Jan. 23, 2003

(30) Foreign Application Priority Data

Jul. 18, 2001 (DE) ........................................ 101 34 986

(51) Int. Cl.[7] .............................................. H01L 23/02
(52) U.S. Cl. ...................... 257/678; 257/723; 361/758
(58) Field of Search ................................ 257/678, 723, 257/724; 361/758, 791, 767, 788, 803

(56) References Cited

U.S. PATENT DOCUMENTS 5,481,436 A * 1/1996 Werther ...................... 361/784
5,973,930 A * 10/1999 Ikeda et al. ................. 361/768
6,507,114 B2 * 1/2003 Hui et al. .................... 257/738

FOREIGN PATENT DOCUMENTS

| EP | 0 073 489 A2 | 3/1983 |
| EP | 1 196 014 A1 | 4/2002 |
| WO | 01/05201 A1 | 1/2001 |

OTHER PUBLICATIONS

Harper, Electronic Packaging and Interconnection Handbook, 1991, McGraw Hill, 6.71–73.*

* cited by examiner

Primary Examiner—Nathan J. Flynn
Assistant Examiner—Leonardo Andújar
(74) Attorney, Agent, or Firm—Laurence A. Greenberg; Werner H. Stemer; Gregory L. Mayback

(57) ABSTRACT

An interface unit and a printed circuit board configuration includes at least two interface units for linking conventional commercially available packages of integrated circuits on a printed circuit board in a more flexible and compact way, which allows compact high-performance electronic circuits to be produced on a small surface area and with low development expenditure.

41 Claims, 3 Drawing Sheets

CONNECTION OF PACKAGED INTEGRATED MEMORY CHIPS TO A PRINTED CIRCUIT BOARD

BACKGROUND OF THE INVENTION

Field of the Invention

The invention relates to the problem of mounting packages that hold integrated semiconductor chips on an electronic printed circuit board.

Electronic circuits that cannot be fabricated entirely on a single semiconductor chip as an integrated microelectronic circuit include electronic and microelectronic components that are disposed on a printed circuit board as a carrier and are connected to one another by interconnects running on the printed circuit board. The electronic components are, for example, passive components such as resistors or capacitors; more complex components, on the other hand, are produced as microelectronic integrated semiconductor circuits that are held in a package with external terminals and are mounted on the printed circuit board. When there are a large number of electronic circuits, a number of such packaged microelectronic semiconductor circuits are disposed on one printed circuit board. For instance, memory modules or other complex circuits, such as, for example, embedded DRAMs, always have a number of microelectronic semiconductor chips disposed on the printed circuit board.

In view of progressive miniaturization, both of the electronic circuit and of the microelectronic integrated circuits themselves, with every circuit to be developed there newly arises the problem of configuring the individual elements of the circuit as compactly as possible. Furthermore, a newly developed circuit is intended to perform as well as possible and be as versatile as possible, which is best achieved by a large part of the electrical operations being executed by the microelectronic integrated semiconductor circuits.

A new integrated semiconductor chip cannot be independently produced for every electric circuit to be developed. It is rather the case that, for reasons of cost, the further technical development of semiconductor chips is proceeding independently of the further development of macroscopic electronic circuits, realized, for instance, on printed circuit boards. Therefore, to perform complex tasks by way of circuit engineering, as many commercially available semiconductor chips as possible are disposed on a printed circuit board. The desire for great versatility and performance capability of the electronic circuit, with at the same time compactness of the printed circuit board, leads to the necessity for as many integrated memory chips as possible to be disposed in a confined space next to one another on the printed circuit board.

Every newly developed configuration of commercially available semiconductor memory chips on a printed circuit board has great effects on the routing of the interconnects on the printed circuit board and requires corresponding expenditure to be invested in the construction of the interconnect routing. At the same time, there are always specifications to be observed regarding the length of typically several hundred interconnects, regarding the thicknesses of the interconnects and regarding the distances between different components. These specifications, compliance with which is required for the technical functional capability of an electronic circuit, greatly restrict the possibilities for the configuration of the electronic and microelectronic components on the printed circuit board. The microelectronic semiconductor chips in particular, which are always held in a package that typically has several dozen to several hundred contact terminals disposed in rows, are difficult to integrate in a circuit layout due to the prescribed configuration of their external terminals.

In particular, in the case of circuits to be newly developed that are sold in small numbers, and, therefore, only allow limited expenditure on construction, the difficulty of integrating microelectronic semiconductor chips represents a particular hurdle.

SUMMARY OF THE INVENTION

It is accordingly an object of the invention to provide a connection of packaged integrated memory chips to a printed circuit board that overcomes the hereinafore-mentioned disadvantages of the heretofore-known devices of this general type and that facilitates the integration of a number of microelectronic semiconductor chips in an electronic circuit to be disposed on a printed circuit board, and, in particular, to dispose integrated semiconductor chips on a single printed circuit board, specifically, in relatively large numbers and, at the same time, in a confined space.

With the foregoing and other objects in view, there is provided, in accordance with the invention, an interface unit for an electronic circuit, the interface unit including an interface body having first electrical contacts for electrically and mechanically connecting the interface body to the printed circuit board, second electrical contacts for electrically and mechanically connecting the interface body to at least one package with an integrated semiconductor chip, and the first electrical contacts electrically connected to the second electrical contacts.

According to the invention, an interface unit that is disposed between the printed circuit board and one or more packaged semiconductor chips and can be connected to both is proposed. With the aid of such an interface unit, more versatile and flexible electrical-mechanical connections can be established between microelectronic integrated semiconductor chips and a printed circuit board.

Conventionally, every integrated, packaged semiconductor chip is electrically and mechanically connected directly to the printed circuit board through the contacts of its package. With the interface units according to the invention, an intermediate level is introduced into such a connection, making it possible for the packaged semiconductor chips to be adapted both to changing contact configurations of the printed circuit board and to different electrical operating parameters on the part of the electronic circuit produced on the printed circuit board. This significantly increases the flexibility of the circuit construction; circuit layouts that were previously technically unfeasible are no longer hindered by the specified configuration of commercially available circuit packages, but, instead, can be realized both by the construction of the interface units according to the invention and by their configuration on the printed circuit board. The invention makes a much more varied integration of integrated semiconductor chips possible in large numbers in a confined space on electronic printed circuit boards and lowers the expenditure and costs for the production of electronic circuits.

In accordance with another feature of the invention, the second electrical contacts are formed at the same time as second mechanical connecting device. The interface unit must be connected to the packages of the integrated semiconductor chips; this connection must be produced mechanically and electrically. It keeps costs down if mechanical connections are configured simultaneously as electrical connections, and vice-versa. Many electrical contacts—generally at least several dozen—are required between an interface unit and a packaged integrated semiconductor chip in order to link the integrated semiconductor circuit to the electronic circuit surrounding it. If these electrical contacts, already high in number, are used at the same time for the mechanical connection of the interface unit to an integrated semiconductor chip, there is no need for otherwise required separate mechanical connecting device. The interface unit and the package of the integrated semiconductor chip can, therefore, be configured more simply.

In accordance with another feature of the invention, the first electrical contacts are pin contacts.

In accordance with a further feature of the invention, the second electrical contacts of the interface unit are formed as elements for a mechanical plug-in connection. A plug-in connection between integrated semiconductor chips and interface units makes simple, low-cost and rapid mounting possible. Such a connection is advantageous even when the integrated semiconductor chips are later to be separated from the printed circuit board.

In accordance with an added feature of the invention, the second electrical contacts are sockets for pin contacts. Because integrated semiconductor chips have to be attached on the upper side of the interface units according to the invention, facing away from the printed circuit board, it is advantageous to be on the safe side with regard to possible damage if the contacts of the interface units are themselves configured as a contact socket, i.e., as a concave depression in the upper side of the interface unit, into which contact pins of the integrated semiconductor chips can be inserted. In such a case, those contact terminals of the interface unit that are not connected to corresponding pins are protected against mechanical or electrical damage.

With regard to the first connecting device, which establishes the connection of the interface unit with respect to the electronic printed circuit board, in accordance with an additional feature of the invention, they are also formed as elements for a mechanical plug-in connection. By contrast with a packaged integrated semiconductor chip with a definitively specified configuration of the contact terminals, the printed circuit board offers more possibilities with regard to different types of mounting on account of its larger surface area. In any event, a mechanically secure connection between the interface unit and the electronic printed circuit board is required. In addition, however, the large surface area of a printed circuit board also offers the possibility, in principle, of providing on sides of the printed circuit board additional connecting elements for various alternative configurations of the interface unit on it. A plug-in connection in which the interface units are inserted perpendicularly into the printed circuit board would offer the advantage that no lateral misalignments can occur, which under some circumstances would lead to damage to the semiconductor chips to be inserted thereabove in a second level. Even in those cases in which interfaces or the integrated semiconductor chips are to be quite frequently unplugged and plugged in again or exchanged when there is a defect, the plug-in connection is an appropriate mechanical type of connection.

In accordance with yet another feature of the invention, the second electrical contacts of the interface unit are disposed such that the interface unit can be simultaneously connected to in each case a proportionate number of contacts of at least two packages of integrated semiconductor chips. Such an embodiment allows even much more versatile connection possibilities between integrated semiconductor chips and an electronic printed circuit board. Definitively specified configurations of contact terminals of a semiconductor package can not only be connected to geometries of contact terminals on the printed circuit board, in that the interface unit respectively carries a single semiconductor chip and is merely used as an adapter for different configurations of the board contacts; rather, the configuration of the interface unit as a connecting element between the printed circuit board and at least two semiconductor chips makes it possible for these semiconductor chips to be linked as a network over the printed circuit board to one another and to the latter. In such a case, the second electrical contacts are disposed on the interface unit such that they are disposed in a concentrated manner in at least two different regions—preferably of the upper side—of the interface unit and, consequently, make it possible for contact to be made respectively with an integrated semiconductor chip of each region of a concentrated number of contacts. This allows a number of semiconductor chips to be simultaneously connected by a single interface unit, it generally being necessary for each semiconductor chip to be connected to a number of interface units, i.e., at least two.

In such a case, a number of interface units and a number of semiconductor chips are used on the printed circuit board. For example, 50 percent of the contacts of a package of a semiconductor chip may be connected to a first interface unit according to the invention, whereas the remaining contacts of the package are connected to a second interface unit of identical construction. Such a configuration makes bridge-like configurations possible, in which the packaged semiconductor chips are connected to the printed circuit board by at least two interface units each. In addition, any other forms are conceivable, for instance, cross-shaped interface units, which respectively make contact with half of two rows of contacts neighboring one another of a semiconductor package.

In accordance with yet a further feature of the invention, the interface unit is of a rectangular form and the second electrical contacts are disposed on two mutually parallel sides of the interface unit such that the interface unit can be connected on each side to in each case a package of an integrated semiconductor chip. In such a case, two interface units respectively serve as "bridge piers" for a semiconductor chip to be attached to them.

In accordance with yet an added feature of the invention, the first connecting device is disposed on two other, mutually parallel sides of the interface unit. In such a case, the electrical connection between the interface units and the printed circuit board—for example, by bonding wires—is produced laterally of the two remaining edges of the rectangular interface unit. As such, the contacts of the integrated semiconductor chips may also be led to contact terminals disposed further away on the printed circuit board. Alternatively, these first electrical contacts may also at the same time be formed as mechanical connecting elements with respect to the printed circuit board, taking up only little surface area under the two remaining side edges of the interface unit.

In the simplest case, the interface unit according to the invention merely establishes a mechanical and electrical connection between one printed circuit board and integrated semiconductor chips. On the other hand, one development provides that the interface unit has an electronic circuit that connects the first and the second electrical contacts to one another. Such a switching electronic circuit between the printed circuit board and the semiconductor chips makes possible a still more flexible electrical adaptation of the two parts to each other than by electrical resistances realized just by lengths of interconnects. Furthermore, a still more complex and, at the same time, compact overall circuit can be realized in this way.

In accordance with yet an additional feature of the invention, the first electrical contacts form a ball-grid array. In such a case, the electrical contacts are formed on the underside of the interface unit to produce spherical solder pads, which are disposed in the form of rows or a matrix, i.e., an array.

Alternatively, the first electrical contacts may be flip-chip contacts. In such a case, the solder points of the printed circuit board and of the interface unit are connected to another without lengthy contact pins in between.

With regard to the connections with respect to the integrated semiconductor chips, in accordance with again another feature of the invention, second electrical contacts are formed for connecting to Thin Small Outline Packages (TSOPs). These packages are standardized and available with different numbers of contacts. Adaptation and configuration of the second electrical contacts of the interface unit according to the invention with respect to such commercially available semiconductor packages makes it possible for integrated semiconductor chips to be integrated into outer electronic circuits at particularly low cost.

With the objects of the invention in view, there is also provided an electronic circuit configuration, including an electronic printed circuit board, at least one package with an integrated semiconductor chip, at least two interface units, each of the units individually mechanically and electrically connected to the printed circuit board, individually mechanically and electrically connected to the at least one package, and each having an interface body with a first connecting device mechanically connecting the interface body to the printed circuit board, a second connecting device mechanically connecting the interface body to the at least one package, first electrical contacts electrically connecting the interface body to the printed circuit board, second electrical contacts electrically connecting the interface body to the at least one package, and the first electrical contacts electrically connected to the second electrical contacts.

Such a configuration integrates integrated semiconductor chips into a more complex electronic circuit in a simple, versatile and low-cost manner and allows novel configurations of semiconductor chips that cannot be realized by conventional methods to be produced on a semiconductor board.

A first embodiment of this circuit configuration provides that the interface units are disposed at equal distances in relation to one another in the form of rows on the printed circuit board and the packages of the integrated semiconductor chips are connected in a bridge-like manner to two neighboring interface units in each case. The forming of many such bridge constructions on one and the same printed circuit board, in particular, makes an especially compact configuration of the semiconductor chips possible, largely independently of the routing of the interconnects of the printed circuit board, and additionally increases many times over the performance capability of the electronic circuits formed in this way.

In accordance with again a further feature of the invention, the interface units and the packages of the integrated semiconductor chips are disposed in the form of a matrix on the printed circuit board. In such an embodiment, the greatest possible flexibility is achieved, in that integrated semiconductor chips are linked in a matrix-like manner above the actual plane of the printed circuit board.

In accordance with a concomitant feature of the invention, the circuit configuration according to the invention is preferably a memory module, in which the packages carry integrated DRAM memory chips. Specifically memory chips such as dynamic random-access memories are often interconnected in high numbers in order to increase the capacity of a memory beyond the degree of integration currently achieved in the case of the individual integrated semiconductor circuit.

Other features that are considered as characteristic for the invention are set forth in the appended claims.

Although the invention is illustrated and described herein as embodied in a connection of packaged integrated memory chips to a printed circuit board, it is, nevertheless, not intended to be limited to the details shown because various modifications and structural changes may be made therein without departing from the spirit of the invention and within the scope and range of equivalents of the claims.

The construction and method of operation of the invention, however, together with additional objects and advantages thereof, will be best understood from the following description of specific embodiments when read in connection with the accompanying drawings.

DESCRIPTION OF THE PREFERRED EMBODIMENTS

Figure 1:
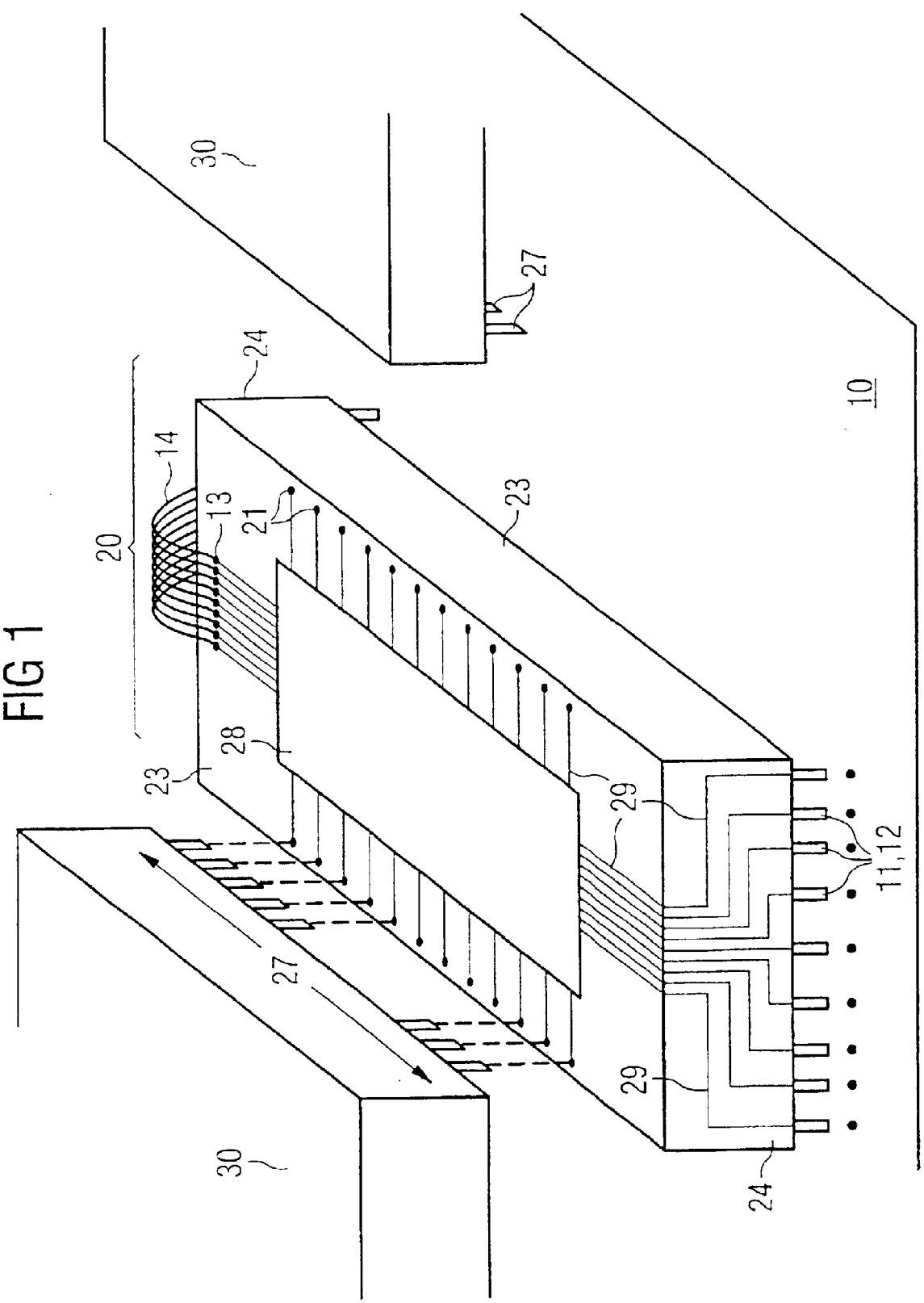
FIG. 1 is a perspective view of an interface unit according to the invention for connecting to a printed circuit board and to at least one package of an integrated semiconductor chip.

Referring now to the figures of the drawings in detail and first, particularly to FIG. 1 thereof, there is shown perspective view of an interface unit 20 according to the invention. The interface unit 20 is of a rectangular form, viewed from above, and has on its underside, in the vicinity of two side faces 24, a first connecting device or means 11, which is formed here as pin-shaped plug-in connecting elements 11 and can be inserted into corresponding sockets of a printed circuit board 10. On the upper side, the interface unit 20 has a large number of second connecting terminals or means 21 for mechanically connecting the interface unit 20 to one or two packages 30 of integrated semiconductor chips. If only a single semiconductor package 30 is connected to the interface unit, it is centrally plugged onto the interface unit 20 depicted. The interface unit 20 may, however, also be connected to a number of semiconductor packages, for example, two, in that their contacts are respectively inserted into a row of the terminals 21 represented on the interface unit. By such a configuration, the interface unit according to the invention switches between different contact configurations of the printed circuit board and the packages to be disposed thereupon of the integrated semiconductor chips. These can be disposed much more flexibly, depending on the configuration of the interface units and their configuration on the printed circuit board, than if they are connected directly to the printed circuit board 10.

In FIG. 1, the first connecting device 11, the contact pins 11, are simultaneously also suitable for establishing the electrical connection 12 with respect to the printed circuit board. For such a purpose, they must be produced from an electrically conductive material. As an alternative thereto, the first electrical contacts may also be formed as solder contact points 12, which are electrically connected to the printed circuit board after the mechanical attachment of the interface unit on the printed circuit board by the bonding wires 14 represented.

The mechanical and electrical connection between the interface unit 20 and the semiconductor package(s) to be attached thereover can be formed in the same way. In the simplest case, plug-in contact sockets 21 are recessed into the interface units. As a second connecting device 21, they establish the mechanical and electrical connection with respect to the semiconductor chips. If these second connecting devices are not connected to corresponding contacts of the semiconductor chips, they are protected against mechanical or electrical damage as contacts recessed into the interface unit.

Schematically represented in the center of the upper side of the interface unit is an electronic circuit 28, which connects the first electrical contacts 11 to the second electrical contacts 21. If no electronic circuit 28 is provided, the contacts 11 and 21 are connected to one another by interconnects in or on the interface unit.

From the second contacts 21, there preferably extends laterally of the faces 23, above the interface unit 20, in each case a semiconductor package 30, which is, in turn, connected at its opposite ends to the printed circuit board 10 through a further interface unit 20.

Figure 2:
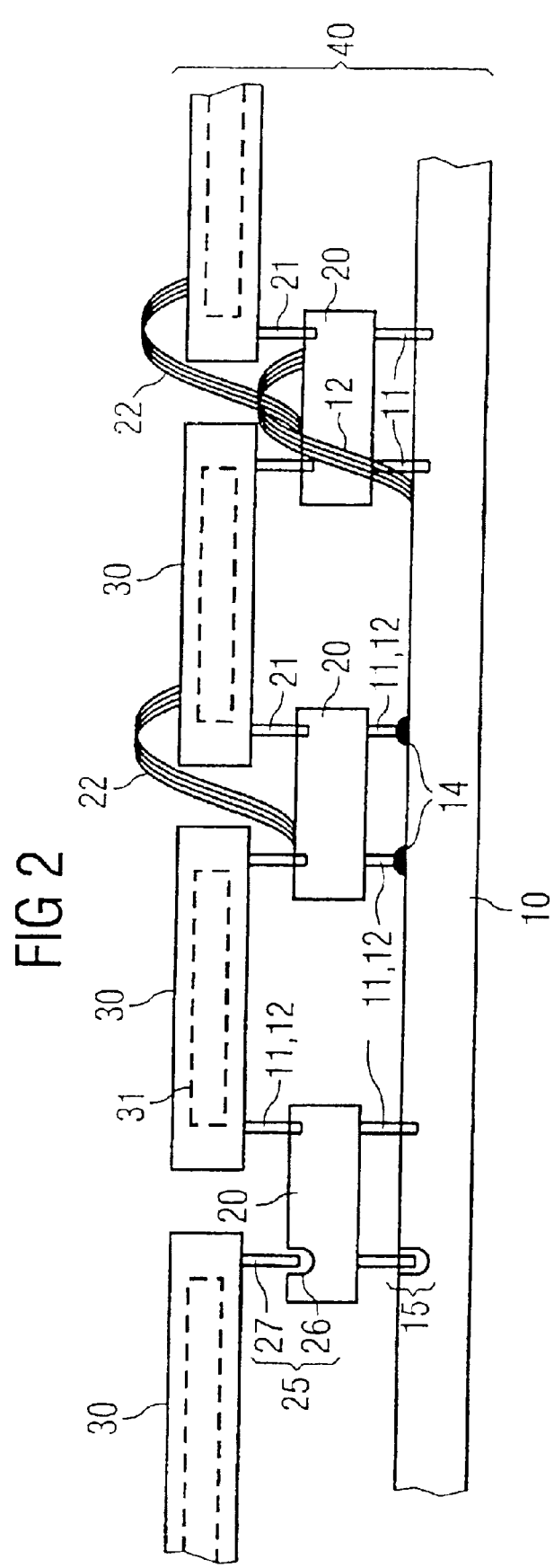
FIG. 2 is a fragmentary, diagrammatic, cross-sectional view of a circuit configuration according to the invention.

The semiconductor configuration obtained in this way on a printed circuit board is represented in FIG. 2. On the printed circuit board 10 there are a number of interface units 20 disposed equidistantly in a row, over which packages 30 with integrated semiconductor chips 31, preferably, with memory chips such as, for example, DRAMs 31, are disposed in a bridge-like manner.

In FIG. 2, various embodiments of the connection of the interface units 20 to the printed circuit board 10 and the semiconductor packages 30 are depicted in a combined manner. The interface unit 20 on the extreme right in FIG. 2 is linked both to the printed circuit board 10 and to the semiconductor packages 30 disposed above it, mechanically by plug-in connections 11 and 21, respectively, and electrically by additional electrical contacts 12, 22, to be precise by bonding connections 12, 22. The interface unit 20 represented in the middle is mechanically and electrically connected to the printed circuit board 10 by contacts 11, which may be either a ball-grid array, i.e., a configuration of contacts with solder balls at the contact end, or flip-chip contacts. The middle interface unit 20 is connected to the semiconductor packages 30 mechanically by plug-in connections 21 and electrically by additional bonding connections 22. The left interface unit is electrically and mechanically connected to the printed circuit board 10 and to the semiconductor packages 30 with the aid of plug-in connections 11, 12. A single plug-in connection 25, for example, with respect to a semiconductor package, includes a socket 26 recessed into the interface unit 20 and a pin contact 27 of the semiconductor package 30 to be inserted therein.

In the case of the configuration represented in FIG. 2, the interface units 20 according to the invention are disposed in a row on the printed circuit board and, together with the semiconductor chips 31 held in packages 30, form the printed circuit board configuration 40 according to the invention.

Figure 3:
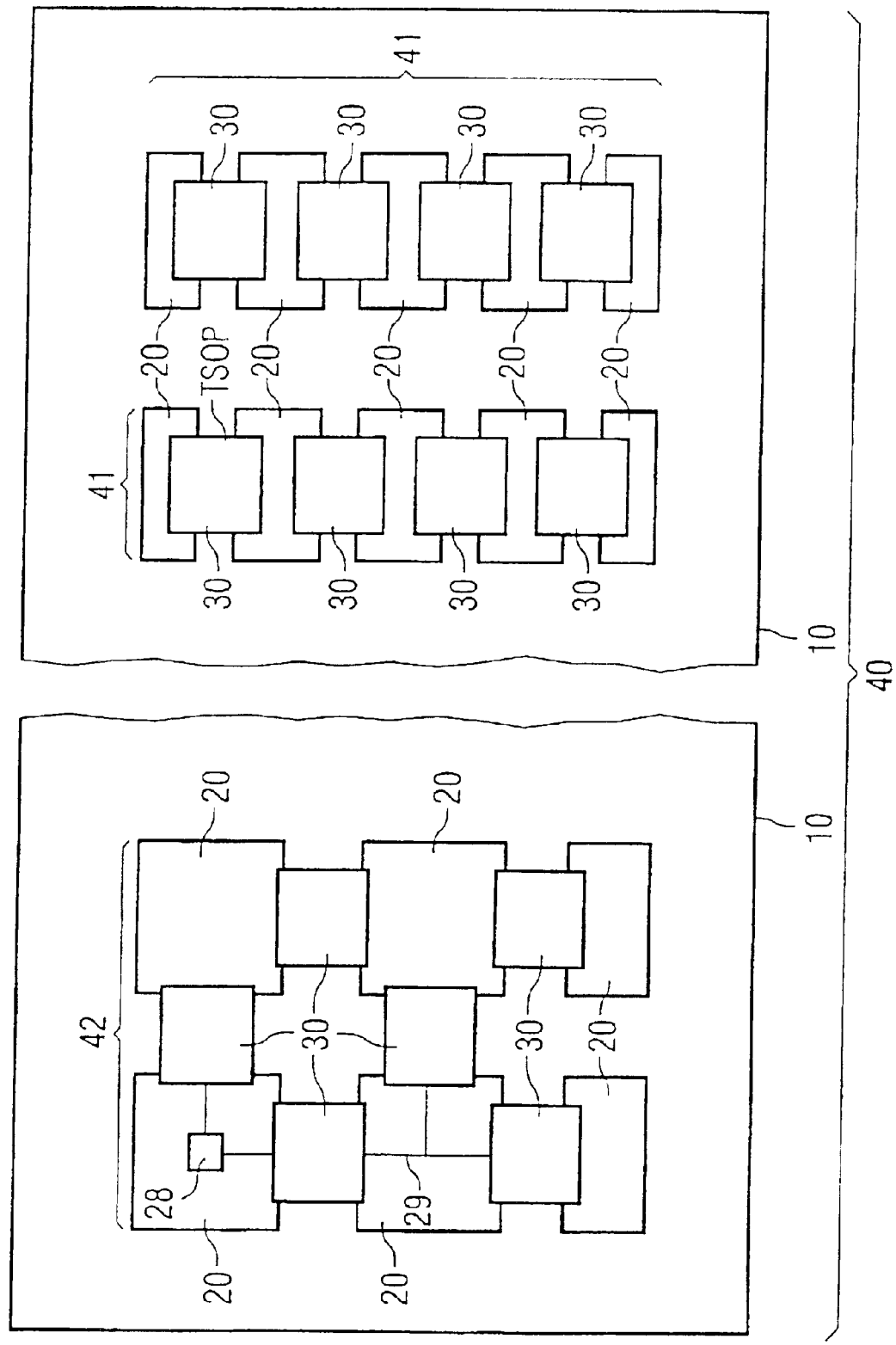
FIG. 3 is a plan view of two different embodiments of a circuit configuration according to the invention.

FIG. 3 shows such a printed circuit board configuration 40 in two different embodiments. In the right-hand half of the printed circuit board 10, two bridge constructions 41 including interface units 20 and semiconductor packages 30 are represented. With them, a large number of integrated semiconductor chips can be loaded in rows close together over large regions on the surface area of the printed circuit board.

A still more complex linkage is made possible by the printed circuit board configuration represented on the left in FIG. 3, in which the interface units 20 and the packages 30 of the integrated semiconductor chips 31 are linked in a matrix-like manner to form a network 42 of chips. In the network configuration 42 represented, each interface unit 20 is connected to up to four semiconductor packages 30, and vice-versa.

In the case of both embodiments, electronic subcircuits 29 present on the interface units 20 can link a number of integrated semiconductor chips 30 to one another. If there is no independent electronic circuit 28 provided on an interface unit, only first terminals 11, 12 and second terminals 21, 22 are connected to one another by lines 29.

The mounting technologies represented in FIG. 3 and corresponding mounting technologies, within the knowledge of one having ordinary skill in the art, for the attachment of semiconductor packages 30 on printed circuit boards 10 with the aid of the interface units according to the invention make it possible for integrated circuits to be linked to printed circuit boards and also directly to one another in the manner of a modular system.

The separation according to the invention of the integrated circuits to be applied to a printed circuit board 10 into a circuit chip—for instance, with a memory circuit such as a DRAM—and a structurally separate data interface 20 allows the integrated circuits to be interconnected more flexibly than previously. The interface units can be produced in series as standardized interfaces and linked with commercially available semiconductor packages to form larger switching networks.

Preferred applications of the present invention are memory modules that are, for example, to be connected to TSOPs or other packages. A configuration of the integrated semiconductor memories on a printed circuit board in the manner of a matrix or in rows, for example, allows the packing density to be increased to a degree that is only reached by the further development of the integrated semiconductor memories themselves some years later, after much longer technical development work.

We claim:

1. An interface unit for an electronic circuit, the interface unit comprising:
    an interface body having:
        an outer side face;
        first electrical contacts for electrically and mechanically connecting said interface body to a printed circuit board;
        second electrical contacts for electrically and mechanically connecting said interface body to at least one package with an integrated semiconductor chip; and
        said first electrical contacts electrically connected to said second electrical contacts;
    said interface body being adapted to connect at least one semiconductor package for extending the semiconductor package laterally beyond said outer side face of said interface body to be connected to the printed circuit board through a further interface unit.

2. The interface unit according to claim 1, wherein said first electrical contacts are pin contacts.

3. The interface unit according to claim 1, wherein said second electrical contacts are formed as elements of a mechanical plug-in connection.

4. The interface unit according to claim 3, wherein said second electrical contacts are sockets for pin contacts.

5. The interface unit according to claim 3, wherein said first electrical contacts are formed as elements of a mechanical plug-in connection.

6. The interface unit according to claim 1, wherein said first electrical contacts are formed as elements for a mechanical plug-in connection.

7. The interface unit according to claim 1, wherein said second electrical contacts are disposed to connect said interface body simultaneously to a proportionate number of contacts of at least two packages with integrated semiconductor chips.

8. The interface unit according to claim 1, wherein:
said interface body is rectangular and has two mutually parallel sides; and
said second electrical contacts are disposed on said sides to connect said interface body to a respective package on each of said sides.

9. The interface unit according to claim 8, wherein:
said interface body has two mutually parallel other sides; and
said first electrical contacts are disposed on said other sides.

10. The interface unit according to claim 1, wherein:
said interface body has two mutually parallel sides; and
said first electrical contacts are disposed on said sides.

11. The interface unit according to claim 1, including an electronic circuit connecting said first electrical contacts and said second electrical contacts to one another.

12. The interface unit according to claim 1, including an electronic circuit electrically connecting said first electrical contacts and said second electrical contacts to one another.

13. The interface unit according to claim 1, wherein said first electrical contacts form a ball-grid array.

14. The interface unit according to claim 1, wherein said first electrical contacts are flip-chip contacts.

15. The interface unit according to claim 1, wherein said second electrical contacts are adapted to connect to TSOPs.

16. The interface unit according to claim 1, wherein the interface unit is adapted to be connected to up to four semiconductor packages.

17. An interface unit for an electronic circuit, the interface unit comprising:
an interface body having:
an outer side face;
a first connecting device for mechanically connecting said interface body to an electrical printed circuit board;
a second connecting device for mechanically connecting said interface body to at least one package with an integrated semiconductor chip;
first electrical contacts electrically connecting said interface body to the printed circuit board;
second electrical contacts for electrically connecting said interface body to the at least one package; and
said first electrical contacts electrically connected to said second electrical contacts;
said interface body being adapted to connect at least one semiconductor package for extending the semiconductor package laterally beyond said outer side face of said interface body to be connected to the printed circuit board through a further interface unit.

18. The interface unit according to claim 17, wherein said second electrical contacts form said second connecting device.

19. The interface unit according to claim 18, wherein said second electrical contacts are formed as elements of a mechanical plug-in connection.

20. The interface unit according to claim 19, wherein said second electrical contacts are sockets for pin contacts.

21. The interface unit according to claim 19, wherein said first connecting device is formed as elements for said mechanical plug-in connection.

22. The interface unit according to claim 17, wherein said first connecting device is formed as elements for a mechanical plug-in connection.

23. The interface unit according to claim 17, wherein said second connecting device is disposed to connect said interface body simultaneously to a proportionate number of contacts of at least two packages with integrated semiconductor chips.

24. The interface unit according to claim 17, wherein:
said interface body is rectangular and has two mutually parallel sides; and
said second connecting device is disposed on said sides to connect said interface body to a respective package on each of said sides.

25. The interface unit according to claim 24, wherein:
said interface body has two mutually parallel other sides; and
said first electrical contacts are disposed on said other sides.

26. The interface unit according to claim 17, wherein:
said interface body has two mutually parallel sides; and
said first electrical contacts are disposed on said sides.

27. The interface unit according to claim 17, including an electronic circuit connecting said first electrical contacts and said second electrical contacts to one another.

28. The interface unit according to claim 17, including an electronic circuit electrically connecting said first electrical contacts and said second electrical contacts to one another.

29. The interface unit according to claim 17, wherein said first electrical contacts form a ball-grid array.

30. The interface unit according to claim 17, wherein said first electrical contacts are flip-chip contacts.

31. The interface unit according to claim 17, wherein said second electrical contacts are adapted to connect to TSOPs.

32. The interface unit according to claim 17, wherein the interface unit is adapted to be connected to up to four semiconductor packages.

33. An electronic circuit configuration, comprising:
an electronic printed circuit board;
at least one package with an integrated semiconductor chip;
at least two interface units, each interface unit:
individually mechanically and electrically connected to said printed circuit board;
individually mechanically and electrically connected to said at least one package; and
each interface unit having an interface body being adapted to connect at least one semiconductor package for extending the semiconductor package laterally beyond an outer side face of said interface body to be connected to the printed circuit board through a further interface unit.

34. The circuit configuration according to claim 33, wherein:
said at least two interface units are disposed at equal distances with respect to one another in rows on said printed circuit board;
said at least one package is a plurality of packages; and
said packages are respectively connected in a bridge-like manner to two neighboring ones of said at least two interface units.

35. The circuit configuration according to claim 33, wherein:
said at least two interface units are disposed at equal distances with respect to one another in rows on said printed circuit board;
said at least one package is a plurality of packages; and
each of said packages respectively connect and bridge to two neighboring ones of said at least two interface units.

36. The circuit configuration according to claim 33, wherein said at least two interface units and said at least one package are disposed in a matrix on said printed circuit board.

37. The circuit configuration according to claim 36, wherein:
the circuit configuration is a memory module; and
said at least one package has at least one integrated DRAM memory chip.

38. The circuit configuration according to claim 33, wherein:
said interface body has:
a first connecting device mechanically connecting said interface body to said printed circuit board;
a second connecting device mechanically connecting said interface body to said at least one package;
first electrical contacts electrically connecting said interface body to said printed circuit board;
second electrical contacts electrically connecting said interface body to said at least one package; and
said first electrical contacts electrically connected to said second electrical contacts.

39. The circuit configuration according to claim 33, wherein:
said interface body has:
first electrical contacts for electrically and mechanically connecting said interface body to a printed circuit board;
second electrical contacts for electrically and mechanically connecting said interface body to at least one package with an integrated semiconductor chip; and
said first electrical contacts electrically connected to said second electrical contacts.

40. The circuit configuration according to claim 33, wherein:
said interface body is adapted to be connected to up to four semiconductor packages.

41. The circuit configuration according to claim 33, wherein:
each semiconductor package is adapted to be connected to up to four interface units.

* * * * *